United States Patent [19]
Prall et al.

[11] Patent Number: 5,945,726
[45] Date of Patent: *Aug. 31, 1999

[54] LATERAL BIPOLAR TRANSISTOR

[75] Inventors: Kirk D. Prall; Mike P. Violette, both of Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/766,659

[22] Filed: Dec. 16, 1996

[51] Int. Cl.⁶ .................................................. H01L 27/082
[52] U.S. Cl. ...................... 257/565; 257/378; 257/423; 257/511; 257/512
[58] Field of Search .................................. 257/423, 511, 257/512, 525, 526, 556, 557, 378, 273, 565, 408, 139, 141, 592, 593

[56] References Cited

U.S. PATENT DOCUMENTS

| | | | |
|---|---|---|---|
| 4,152,627 | 5/1979 | Priel et al. | 315/227 |
| 4,485,393 | 11/1984 | Kumamaru et al. | 357/52 |
| 4,583,106 | 4/1986 | Anantha et al. | 357/35 |
| 4,987,089 | 1/1991 | Roberts | 437/34 |
| 5,049,966 | 9/1991 | Wald | 357/41 |
| 5,218,228 | 6/1993 | Williams et al. | 257/593 |
| 5,358,884 | 10/1994 | Violette | 437/341 |
| 5,498,885 | 3/1996 | Deen et al. | 257/141 |
| 5,574,306 | 11/1996 | Wang et al. | 257/557 |
| 5,608,236 | 3/1997 | Arakawa et al. | 257/123 |
| 5,666,001 | 9/1997 | Miwa | 257/592 |
| 5,717,241 | 2/1998 | Malhi et al. | 257/378 |
| 5,828,124 | 10/1998 | Villa | 257/557 |

FOREIGN PATENT DOCUMENTS

| | | |
|---|---|---|
| 5773964 | 5/1982 | Japan . |
| 5850772 | 3/1983 | Japan . |
| 2294063 | 12/1990 | Japan . |

OTHER PUBLICATIONS

Akiyama, N., et al., "CMOS–Compatible Lateral Bipolar Transistor for BiCMOS Technology: Part I—Modeling", *IEEE Trans. on Electron Devices*, 39, 948–951, (Apr. 1992).

Grove, A., *Physics and Technology of Semiconductor Devices*, John Wiley & Sons, Pubs., New York, 224, (1967).

Hayden, J., et al., "A High–Performance 0.5–um BiCMOS Technology for East 4–Mb SRAM's", *IEEE Trans. on Electron Devices*, 39, 1669–1679, (Jul. 1992).

Tamba, A., et al., "CMOS–Compatible Lateral Bipolar Transistor for BiCMOS Technology: Part II—Experimental Results", *IEEE Trans. on Electron Devices*, 39, 1865–1869, (Aug., 1992).

Verdonckt–Vanderbrok, S., et al., "High Gain Lateral Bipolar Transistor", *Int. Electron Devices Meeting: Technical Digest*, San Francisco, CA, 406–409, (Dec. 1988).

Verdonckt–Vanderbrok, S., et al., "High–Gain Lateral Bipolar Action in a MOSFET Structure", *IEEE Trans. on Electron Devices*, 38, 2487–2496, (Nov. 1991).

Verdonckt–Vanderbrok, S., et al., "High–Gain Lateral p–n–p Bipolar Action in a p–MOSFET Structure", *IEEE Electron Device Lett.*, 13, 312–313, (Jun. 1992).

*Primary Examiner*—Carl Whitehead, Jr.
*Attorney, Agent, or Firm*—Schwegman, Lundberg, Woessner & Kluth P.A.

[57] ABSTRACT

A substantially concentric lateral bipolar transistor having a base region that is disposed about a periphery of an emitter region, and a collector region that is disposed about a periphery of the base region to form the concentric lateral bipolar transistor of the invention. A gate overlies the substrate and at least a portion of the base region. At least one electrical contact is formed connecting the base and the gate, although a plurality of contacts may be formed. A further bipolar transistor is formed according to the following method of the invention. A base region is formed in a substrate and a gate region is formed overlying at least a portion of the base region. Emitter and collector terminals are formed on opposed sides of the base region. The gate is used as a mask during first and second ion implants. During the first ion implant the ions bombard the substrate from a first direction to grade a base/emitter junction, and during the second ion implant ions bombard the substrate from a second direction to grade a base/collector junction. Also a lateral bipolar transistor having a decreased base width as a result of implanting ions after fabrication of collector and emitter regions to enlarge the collector and emitter regions, thereby decreasing the base region and increasing gain.

22 Claims, 7 Drawing Sheets ically equal to the MOS channel length. As MOS devices have shrunk the channel lengths have approached the base width of a bipolar making the lateral bipolar transistor possible.

LATERAL BIPOLAR TRANSISTOR

FIELD OF THE INVENTION

The invention relates to semiconductor technology, and in particular to a lateral bipolar transistor and the process for making same.

BACKGROUND OF THE INVENTION

Recently respectable bipolar transistors have been formed using a CMOS (complementary metal-oxide semiconductor) transistor in a typical CMOS process. These bipolar transistors are also referred to as lateral bipolar transistors and are reported to have a threshold frequency (Ft) as high as 3.7 Ghz and a Beta as high as 1000. This alternate method of forming a bipolar transistor has some strong advantages. The process is extremely simple compared to a typical BiCMOS process that uses complicated and expensive process flows costing 30–40% more than a typical CMOS flow. The use of a CMOS flow to create a lateral bipolar transistor adds negligible cost to a current CMOS process and provides a capable bipolar transistor.

The lateral bipolar transistor is fabricated using a typical lightly doped drain (LDD) MOS transistor. An NPN device is formed from an NMOS transistor and a PNP device is formed from a PMOS transistor. The base width of the lateral bipolar transistor is determined by and is usually equal to the MOS channel length. As MOS devices have shrunk the channel lengths have approached the base width of a bipolar making the lateral bipolar transistor possible.

In one variation a base implant is added to the process steps to balance the bipolar and MOS modes of operation. In addition the typical lateral bipolar transistor employs a base-gate contact for providing an electrical connection between the base and gate of the lateral bipolar transistors. Since the base is typically fabricated in the well, the gate depletes the base while the substrate contact controls the base voltage.

The inventors have discovered that the lateral bipolar transistors, fabricated according to the structures described above, have a reduction in gain at high currents or at high bias voltages. Thus, it would be desirable to have a CMOS-based bipolar transistor having improved bipolar performance during high current or high bias voltage conditions.

SUMMARY OF THE INVENTION

One exemplary embodiment of the invention is a substantially concentric lateral bipolar transistor and the method of forming same. The lateral bipolar transistor includes a base region disposed about a periphery of an emitter region and a collector region disposed about a periphery of the base region. A gate overlies the substrate and at least a portion of the base region. At least one electrical contact is formed connecting the base and the gate, although a plurality of contacts may be formed. The invention includes a metal oxide semiconductor inversion region formed in the substrate and a retrograde well formed below the inversion region.

In a further exemplary embodiment a bipolar transistor is formed according to the following method. A base region is formed in a substrate and a gate region is formed overlying at least a portion of the base region. Emitter and collector terminals are formed on opposed sides of the base region. The gate is used as a mask during first and second ion implants. During the first ion implant the ions bombard the substrate from a first direction to grade a base/emitter junction, and during the second ion implant ions bombard the substrate from a second direction to grade a base/collector junction.

In a further exemplary embodiment the invention is a lateral bipolar transistor having a decreased base width. The decreased base region is created by implanting ions after fabrication of collector and emitter regions to enlarge the collector and emitter regions, thereby decreasing the base region and increasing gain.

DETAILED DESCRIPTION OF THE PREFERRED EMBODIMENTS

Figure 1:
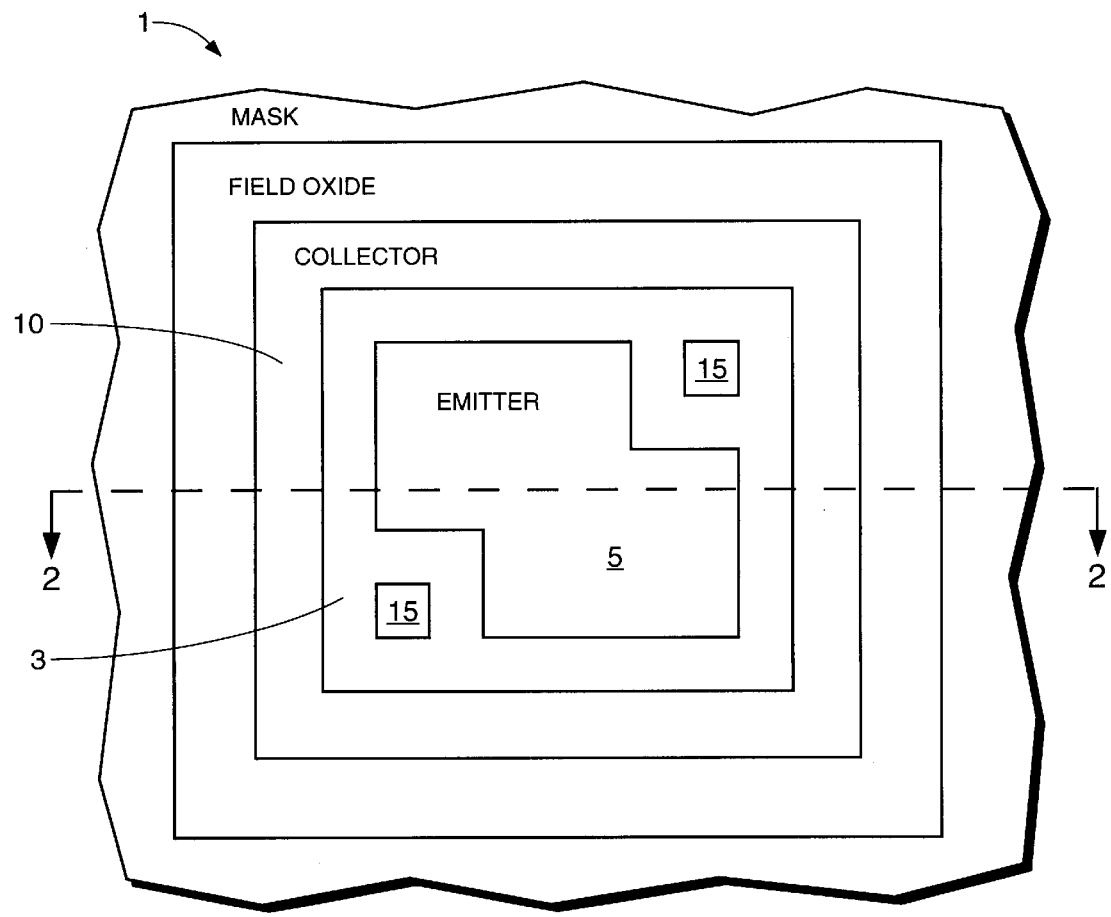
FIG. 1 is a top planar view of a layout of the substantially concentric lateral bipolar transistor of the invention.

One embodiment of the present invention is a concentric lateral bipolar transistor and the method of forming same. The invention includes multiple base-gate contacts. FIG. 1 is a top planar view of a layout of the concentric lateral bipolar transistor 1 of the present invention. This particular layout advantageously reduces the consumption of die area by the lateral bipolar transistor while enhancing performance of the lateral bipolar transistor 1. The base region underlies a poly gate region 3 and is essentially a three dimensional annulus of any shape interposed between an emitter region 5 and a collector region 10. Thus, the base region is disposed about the emitter region 5 (represented here as a polygonal structure), and the collector region 10 is disposed about the base region. A reduced base resistance and/or reduced stray capacitance of the concentric lateral bipolar transistor 1 improves the Ft. In this configuration all of the emitter current is driven toward the collector thereby increasing collector efficiency. In FIG. 1 two base-gate contacts are used to reduce the base resistance. Even though there are two base-gate contacts 15 the total base contact area is very small thereby contributing to minimum device size. In this particular layout of the bipolar transistor 1, an additional, masked, high energy, high dose, angled implant is used to selectively increase a size of the emitter and collector junctions thereby reducing the base width and providing higher gain and higher Ft.

Figure 2:
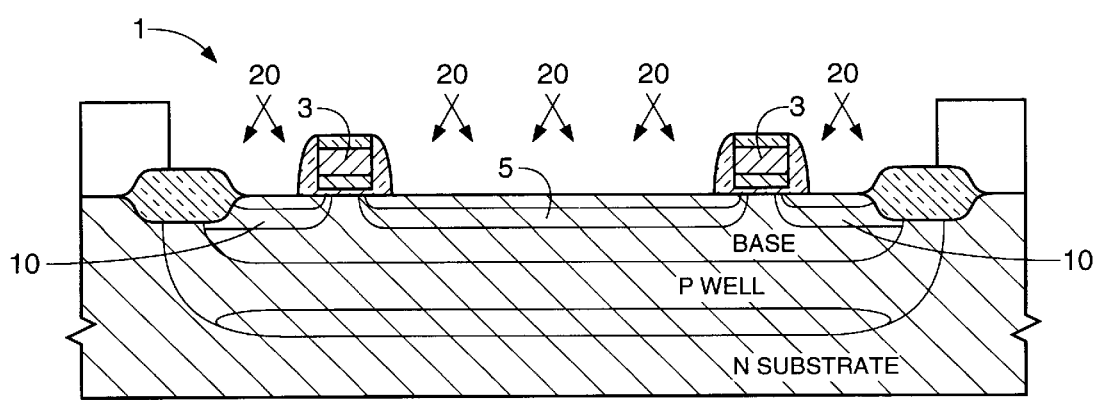
FIG. 2 is a cross sectional view of the transistor in FIG. 1, taken along line 2—2 of FIG. 1, following a high energy, high dose implant.

FIG. 2 is a cross sectional view of the transistor in FIG. 1 following the high energy, high dose implant 20.

Figure 3:
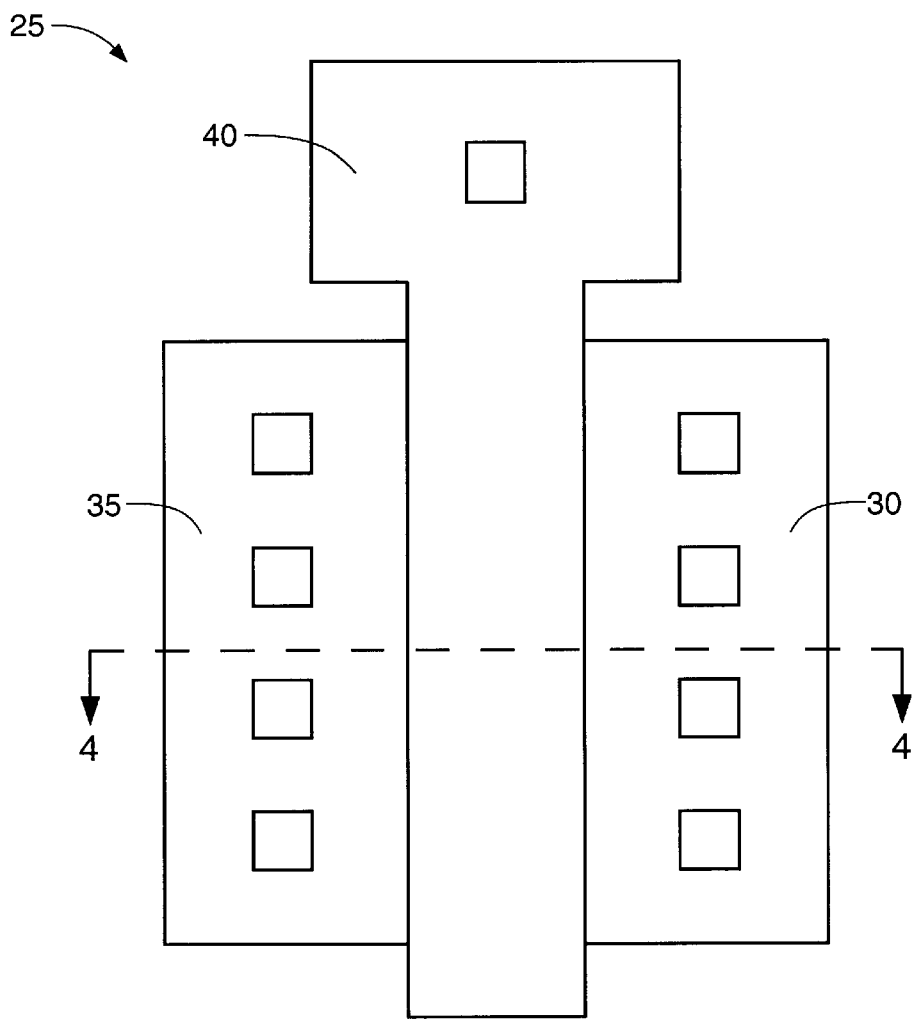
FIG. 3 is a top planar view of a lateral bipolar transistor of a further embodiment of the invention.
Figure 4:
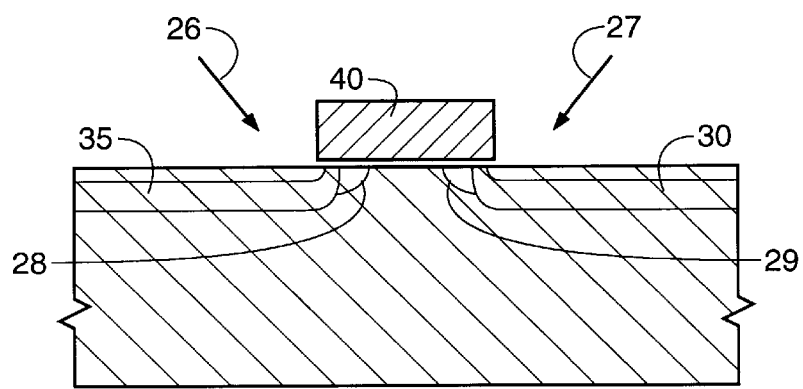
FIG. 4 is a cross sectional view of the bipolar transistor of FIG. 3, taken along line 4—4 of FIG. 3.

FIG. 3 is a top planar view of the lateral bipolar transistor 25 of a further embodiment of the present invention, and FIG. 4 is a cross sectional view of the bipolar transistor 25 of FIG. 3. The lateral bipolar transistor 25 is linear. As shown in FIG. 4, a first angled implant 26 grades the base doping at the base-emitter junction, and a second angled implant 27 grades the base at the base-collector junction. The graded base 28 at the base-emitter junction increases the drift velocity of minority carriers while the graded base 29 at the base-collector junction increases the doping of the collector region 30 which improves the high current operation of the transistor. These two implants use opposite dopant types. Therefore the linear layout is used in order to identically orient the collector region 30 and the emitter region 35 such that only one masking step is required to protect other devices during the angled implant of the lateral bipolar transistor 25. Since only a small number of bipolar devices are needed in most applications, such as sense amplifiers and output drivers, it is possible to orient the emitter region 35 and collector region 30 when using the linear arrangement of the invention in order that the angled implants do not have to be masked separately. Since each of these implants is done at an angle, the poly gate 40 shields the opposite electrode so that the one implant does not affect the other. The high energy, high dose angle implant of the first embodiment can also be used in this embodiment, without the addition of a further mask, to increase the depths of the emitter region 35 and the collector region 30 and decrease the base width.

In both embodiments described above, the base resistance of the bipolar transistors is further reduced by adding retrograde wells. In essence, the doping of the wells below the MOS inversion regions is increased to reduce the base resistance without affecting the critical surface doping. Both NPN and PNP bipolar transistors are formed on either N or P type substrates with proper well formation and biasing.

Figure 5:
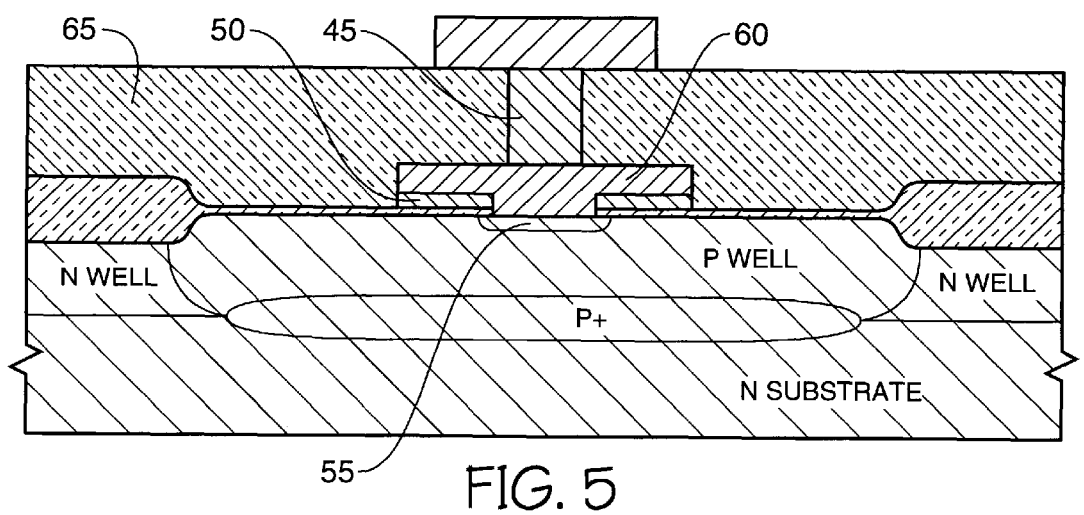
FIG. 5 is a cross sectional view of one type of base-gate contact.

In addition, in both embodiments described above a base-gate contact is formed. In most cases a single buried contact reduces the die area consumed. FIG. 5 illustrates a cross sectional view of an exemplary type of base-gate contact 45 which can be formed according to the present invention. When forming the gate a first poly layer 50 is deposited and etched to expose the base 55 in the contact region. A second poly layer 60 is then deposited to contact the base 55. Both poly layers 50 and 60 are patterned and etched to define the gate region. A thick oxide layer 65 is deposited to overly the poly layers 50 and 60. The oxide 65 is patterned and etched to create an opening exposing the poly layer 60. Tungsten is then formed in the opening. The tungsten forms the base/gate contact 45. Although only one type of base-gate contact is shown in FIG. 5 other types may also be used. In addition a plurality of the base-gate contacts (shown in FIG. 5) may be used in the bipolar transistor of the invention, for example, it may be used to form the base-gate contacts 15 used in the bipolar transistor shown in FIG. 1.

The process for making an NPN lateral bipolar transistor of the invention is shown cross sectionally in FIGS. 6–13. The cross section is representative of the cross section indicated in FIG. 1. The particular process described below is for an N type substrate. It is understood that a similar process is used to form the transistors of the invention with a P type substrate.

Figure 6:
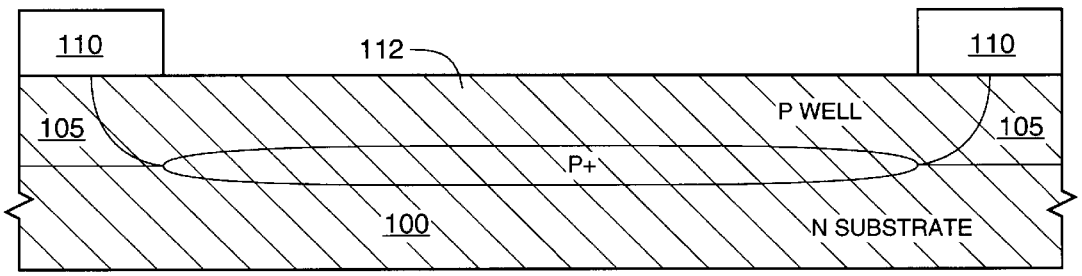
FIGS. 6–13 are cross sectional views of a process for forming the lateral bipolar transistor of the invention.

As illustrated in FIG. 6 a light, $2\ E^{12}$, phosphorus implant preferably in the range of about 50 KeV is performed to adjust a surface concentration of the N-type substrate 100 and to form N-wells 105. A thick oxide 110 is then deposited and photolithography is used to pattern the thick oxide 110 to define a future P-well opening. Boron is implanted in exposed regions preferably at a dose of $7\ E^{12}$ at 50 KeV and is diffused preferably to a depth of 3 micro__. Next a high energy boron implant preferably of $2\ E^{13}$ at 600 KeV forms a retrograde P-well 112 which reduces the base resistance in the bipolar transistors and improves latch-up immunity. The thick oxide layer is then removed during an etch.

Figure 7:
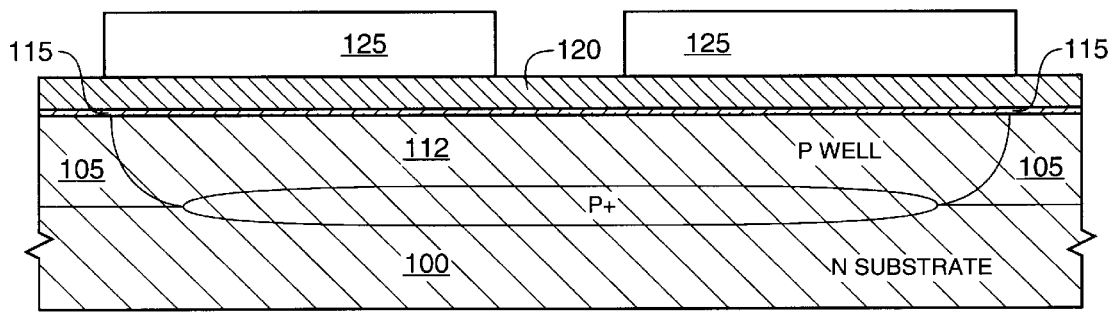

As shown in FIG. 7 an oxide pad 115 (preferably about 200 Angstrom thick) is grown and a nitride layer 120 (preferably about 2000 Angstrom thick) is deposited and patterned with a photoresist mask 125.

Figure 8:
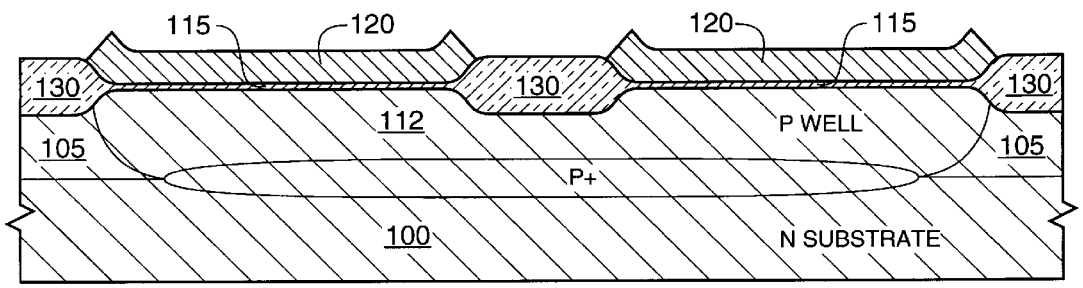

In FIG. 8 the nitride 120 is etched in unmasked regions to expose the substrate. A field oxide region 130 (preferably about 450 Angstrom thick) is then grown on the exposed portion of the substrate. Next the oxide pad 115 and the nitride layer 120 are removed.

Figure 9:
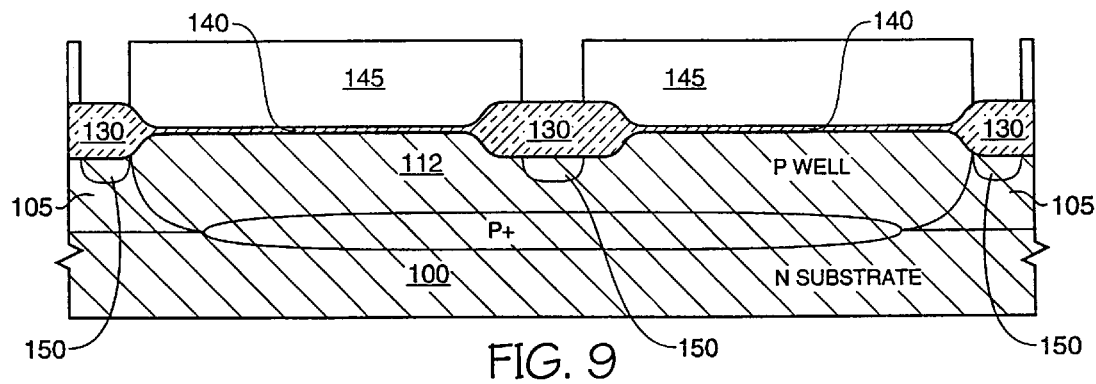

FIG. 9 shows a sacrificial oxide layer 140 which is preferentially grown to about a 350 Angstrom thickness. A photoresist mask 145 defines field implant regions. A first boron implant of (preferably) about $3\ E^{12}$ at about 130 KeV and a second enhancement boron implant of (preferably) at about $2\ E^{12}$ at about 25 KeV are performed to form P type field implant regions 150. The photoresist mask 145 is then removed and the sacrificial oxide 140 is striped. An optional base implant of (preferably) about $1.0\ E^{13}$ cm-2 of boron difluoride ions at 20 KeV may also be implanted to guide the electrons away from the surface of the intrinsic base.

Figure 10:
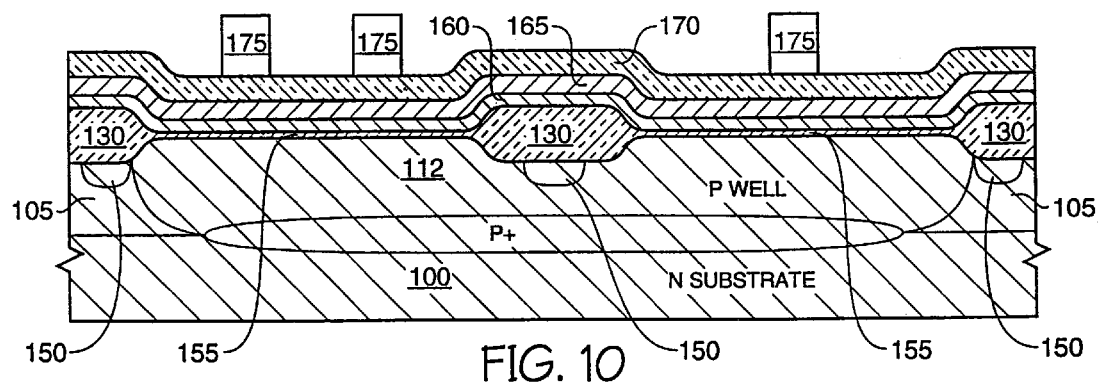

As shown in FIG. 10, a gate oxide layer 155 is grown preferably to a thickness of 100 Angstroms. In this first embodiment a first polycrystalline silicon layer 160 having a thickness of 500 Angstroms is deposited and then patterned and etched according to a photoresist mask (not shown) to define contact regions to the substrate. The unmasked first polycrystalline silicon layer 160 and the gate oxide layer 155 are then etched to expose the substrate in the contact regions which are not shown in this cross section. Next, a second polycrystalline silicon layer 165, preferably of about 1500 Angstroms in thickness, is deposited overlying the first polysilicon layer 160. A Boron implant preferably of about $1\ E^{15}$ at 25 KeV is performed to dope the polycrystalline silicon layers 160 and 165. This implant is followed by a deposition of an oxide layer 170, preferably having a thickness of about 2500 Angstroms. Finally gates are defined with photoresist mask 175.

Figure 11:
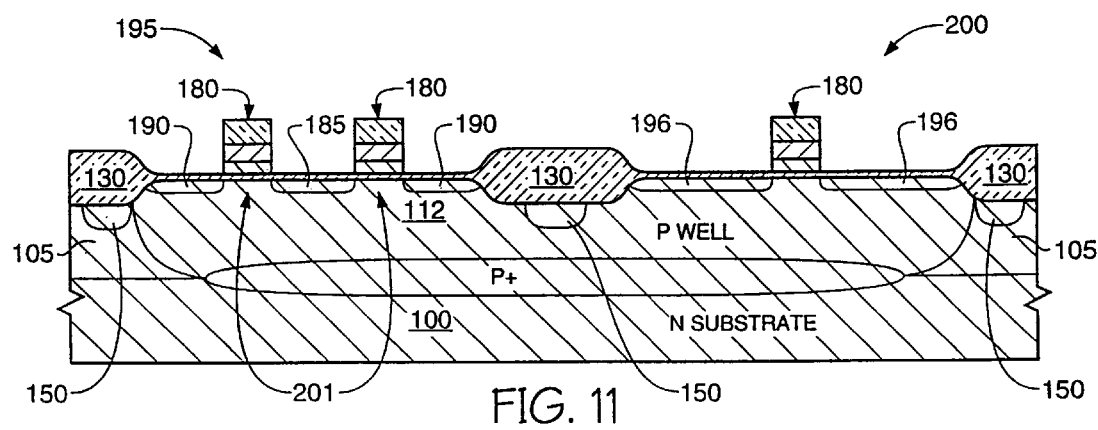

The oxide layer 175, the polycrystalline silicon layers 165 and 160, and gate oxide layer 155 of FIG. 10 are etched to form gate regions 180 shown in FIG. 11. A lightly doped drain Arsenic implant, having a preferred dosage of $1\ E^{12}$ at 100 KeV and an angled Arsenic implant having a preferred dosage of $5\ E^{12}$ at 100 KeV are performed to form N+ emitter region 185, N+ collector region 190 in the lateral bipolar transistor 195 and to form source/drain regions 196 in the CMOS 200. As shown in FIG. 11 and the top planar view in FIG. 1, the base 201 (underlying the poly gate region of FIG. 1) is concentric with the annular shaped collector 190 (collector 10 of FIG. 1) and lies in between the collector 190 and the emitter 185 (emitter 5 of FIG. 1).

Figure 12:
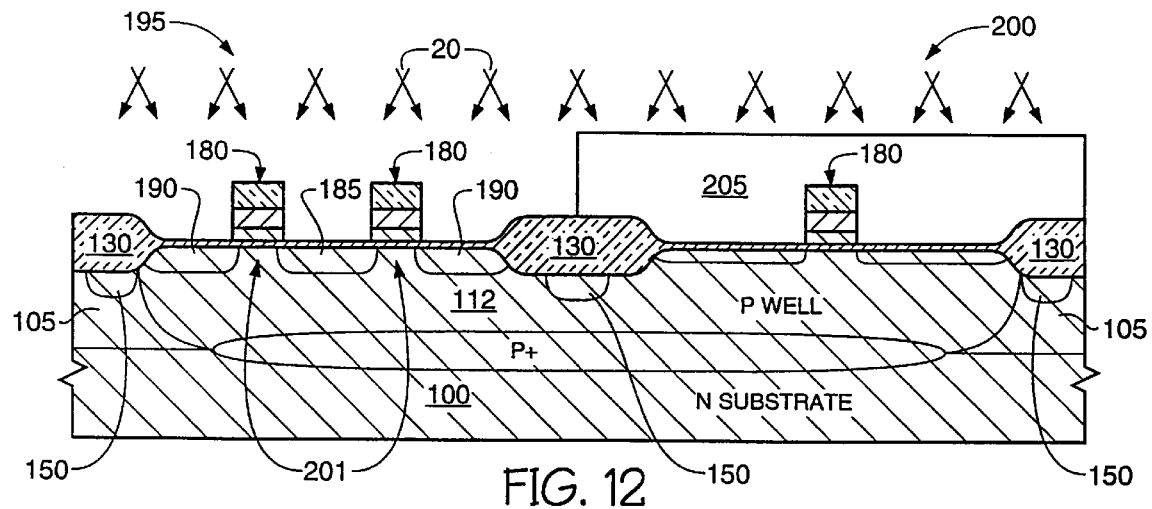

As shown in FIG. 12, the gate regions 180 of the lateral bipolar transistor 195 are used as a pattern during a bipolar implant. Other devices such as CMOS device 200 are masked with photoresist 205 during this step. The bipolar implant deepens and widens the collector region 190 and emitter region 185 thereby decreasing the width of the base 201 in the lateral bipolar transistor 195. The bipolar implant uses a dosage of arsenic atoms preferably ranging between about $5\ E^{14}$ and about $1\ E^{16}$ (most preferably at $5\ E^{15}$) and at an energy of about 30 to about 200 KeV (most preferably 120 at KeV). The bipolar implant is preferably performed at an angle of 20 degrees from a perpendicular to the substrate, although the angle may range between about 10 and about 40 degrees.

Figure 13:
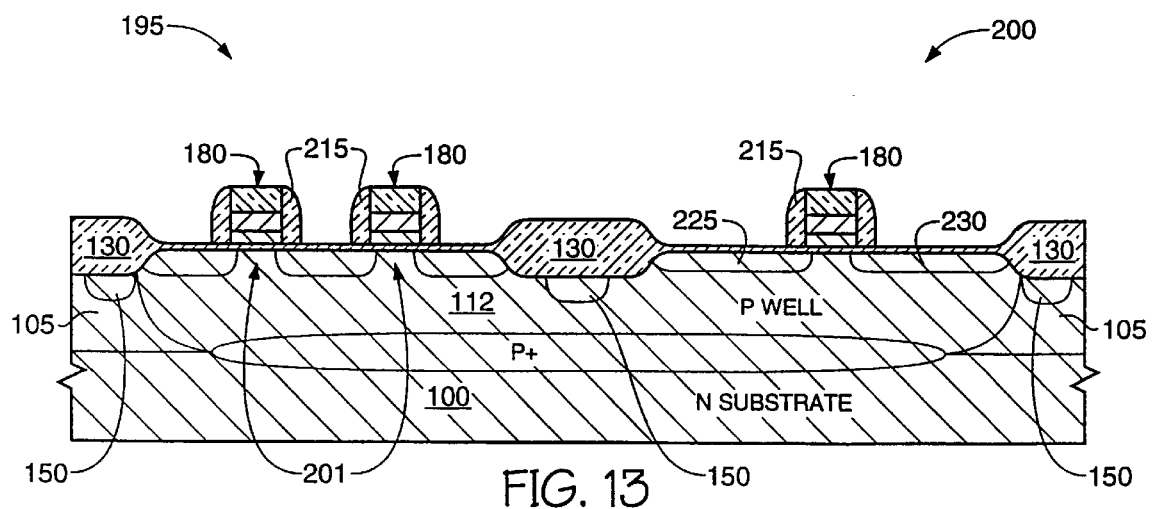

As seen in FIG. 13, the photoresist 205 of FIG. 12 is removed and a conformal oxide layer (not shown) is deposited and then etched to form spacers 215 on the sidewalls of the gate regions 180. Following the spacer 215 formation an arsenic implant is performed preferably at a dose of 3 E15 at 50 KeV at zero degrees thereby patterning N+ source 225 and drain 230 regions in the CMOS device 200.

Figure 14:
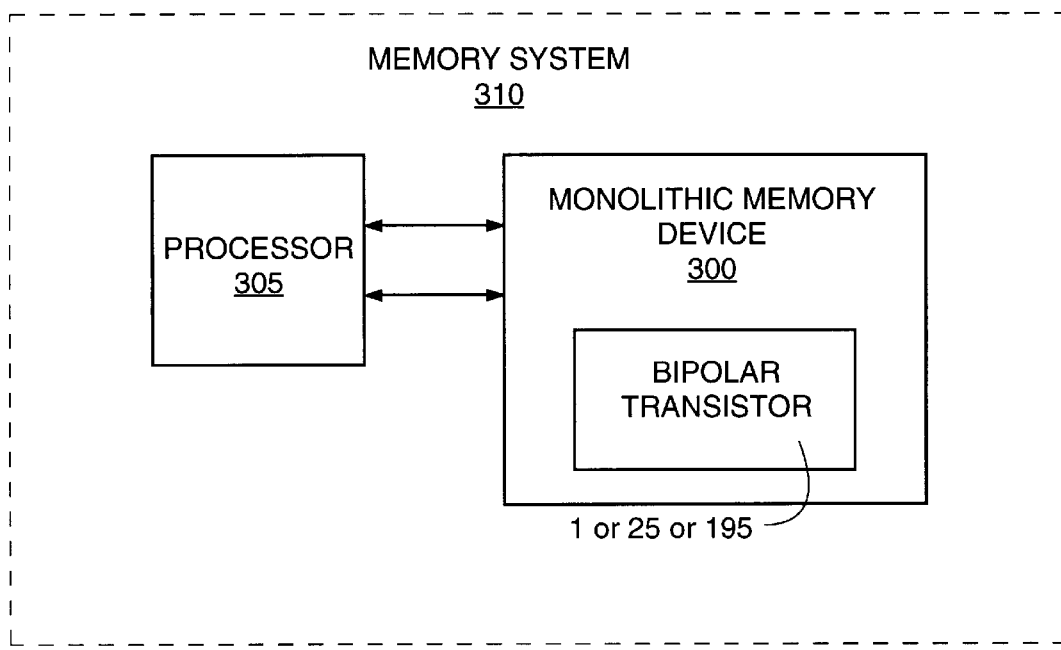
FIG. 14 is a block schematic of a memory system of the invention.

The bipolar transistors 1, 25, and 195 of the invention, shown in FIGS. 1, 3 and 11–13 respectively, of the invention are typically used in a monolithic memory device 300, such as a dynamic random access memory device, as shown in FIG. 14. The monolithic memory device 300 and a processor 305 form part of a memory system 310. The processor 305 is typically used to generate external control signals which access the monolithic memory device 300 either directly or through a memory controller.

Although exemplary embodiments have been described above the invention should only be limited by the claims.

What is claimed is:

1. A lateral bipolar transistor formed in a semiconductor substrate, comprising:

an emitter region;

a base region disposed about a periphery of said emitter region the base region being reduced with a source-drain implant;

a gate region disposed at least over a portion of the base region and having at least one contact to the base region; and a collector region disposed about a periphery of said base region.

2. A lateral bipolar transistor formed in a semiconductor substrate, comprising:

an emitter region;

a base region disposed about a periphery of said emitter region;

a collector region disposed about a periphery of said base region;

a gate overlying the substrate and at least a portion of said base, said gate having a width, said portion of said base having a width smaller than said width of said gate; and an electrical contact connecting said base and said gate.

3. A transistor, comprising:

a substrate;

a first terminal formed in the substrate to have an annular shape;

a second terminal formed in the substrate within a region encircled by said first terminal;

a base formed in the substrate between said first terminal and said second terminal; and a gate overlying said base.

4. The transistor as specified in claim 3, further comprising a base-gate contact region wherein said base and said gate are in electrical communication with each other.

5. The transistor as specified in claim 3, further comprising a plurality of base-gate contact regions wherein said base and said gate are in electrical communication with each other.

6. The transistor as specified in claim 3, wherein said transistor is bipolar and utilizes metal oxide semiconductor action.

7. The transistor as specified in claim 3, wherein said transistor is bipolar further comprises a metal oxide semiconductor layer underlying said gate and overlapping said base.

8. The transistor as specified in claim 3, further comprising:

a metal oxide semiconductor inversion region underlying said gate; and a retrograde well formed below the metal oxide semiconductor inversion region.

9. A transistor, comprising:

a substrate;

a first terminal formed in the substrate to have an annular shape;

a second terminal formed in the substrate within a region encircled by said first terminal;

a base formed in the substrate between said first terminal and said second terminal; and a gate overlying said base, said base having a width smaller than a width of said gate.

10. A system comprising:

a monolithic memory device comprising a lateral bipolar transistor formed in a semiconductor substrate wherein the lateral bipolar transistor comprises:

an emitter region;

a base region disposed about a periphery of said emitter region and having a width reduced by implants;

a gate region disposed at least over a portion of the base region and having at least one contact to the base region;

a collector region disposed about a periphery of said base region; and a processor configured to access the monolithic memory device.

11. A system comprising:

a monolithic memory device comprising a lateral bipolar transistor formed in a semiconductor substrate, wherein the lateral bipolar transistor comprises:

an emitter region;

a base region disposed about a periphery of said emitter region;

a collector region disposed about a periphery of said base region;

a gate overlying at least a portion of said base region, said gate having a width, said portion of said base region having a width smaller than said width of said gate;

an electrical contact connecting said base region and said gate; and a processor configured to access the monolithic memory device.

12. The lateral bipolar transistor as specified in claim 1, wherein said bipolar transistor utilizes a metal oxide semiconductor inversion region in at least a portion of the gate.

13. The lateral bipolar transistor as specified in claim 12, wherein a retrograde well is formed below the metal oxide semiconductor inversion region.

14. The lateral bipolar transistor as specified in claim 1, wherein a base emitter junction is graded by implant ions.

15. The lateral bipolar transistor as specified in claim 1, wherein a base collector junction is graded by implant ions.

16. The lateral bipolar transistor as specified in claim 1, wherein the base is narrowed by angled implant ions.

17. A linear lateral bipolar transistor, comprising:

an emitter region;

a linear base region having one side disposed adjacent to said emitter region;

a gate region disposed at least over a portion of the linear base region and having at least one contact to the linear base region, a portion of said linear base region having a width smaller than said width of said gate region; and a collector region disposed adjacent to a second side of the linear base region.

18. The linear lateral bipolar transistor as specified in claim 17, wherein said linear bipolar transistor utilizes a metal oxide semiconductor inversion region in at least a portion of the gate.

19. The linear lateral bipolar transistor as specified in claim 18, wherein a retrograde well is formed below the metal oxide semiconductor inversion region.

20. The linear lateral bipolar transistor as specified in claim 17, wherein a base-emitter junction is graded by angled implant ions.

21. The linear lateral bipolar transistor as specified in claim 17, wherein a base-collector junction is graded by angled implant ions.

22. The linear lateral bipolar transistor as specified in claim 17, wherein a base-emitter junction is graded by first implant ions, a base-collector junction is graded by second implant ions, and the first and second implant ions are of opposite dopants.

* * * * *